US011602066B2

(12) United States Patent
Tresanini et al.

(10) Patent No.: US 11,602,066 B2
(45) Date of Patent: Mar. 7, 2023

(54) EXTRACTABLE STRUCTURE FOR HOUSING ELECTRONIC COMPONENTS

(71) Applicant: ANSALDO STS SPA, Genoa (IT)

(72) Inventors: Renzo Tresanini, Genoa (IT); Nicola Baschiera, Rossiglione (IT); Paolo Spiga, Genoa (IT)

(73) Assignee: HITACHI RAIL STS S.P.A., Genoa (IT)

( * ) Notice: Subject to any disclaimer, the term of this patent is extended or adjusted under 35 U.S.C. 154(b) by 276 days.

(21) Appl. No.: 16/344,760

(22) PCT Filed: Sep. 8, 2017

(86) PCT No.: PCT/IB2017/055419
§ 371 (c)(1),
(2) Date: Apr. 24, 2019

(87) PCT Pub. No.: WO2018/051218
PCT Pub. Date: Mar. 22, 2018

(65) Prior Publication Data
US 2019/0313545 A1    Oct. 10, 2019

(30) Foreign Application Priority Data

Sep. 15, 2016 (IT) .................. 102016000093103

(51) Int. Cl.
*H05K 7/00* (2006.01)
*H05K 7/14* (2006.01)
*H05K 7/18* (2006.01)

(52) U.S. Cl.
CPC ......... *H05K 7/1449* (2013.01); *H05K 7/1421* (2013.01); *H05K 7/1425* (2013.01); *H05K 7/1454* (2013.01); *H05K 7/18* (2013.01)

(58) Field of Classification Search
CPC .. H05K 7/1449; H05K 7/1425; H05K 7/1421; H05K 7/1454; H05K 7/18
USPC ........................................... 361/752
See application file for complete search history.

(56) References Cited

U.S. PATENT DOCUMENTS

| | | | | |
|---|---|---|---|---|
| 4,718,858 A | * | 1/1988 | Godfrey ............... | H01R 13/629 439/296 |
| 5,376,011 A | * | 12/1994 | Rudy, Jr. ............. | H01R 13/629 439/248 |
| 5,622,511 A | * | 4/1997 | Jarrett ................ | H01R 13/6315 439/248 |
| 6,504,730 B1 | * | 1/2003 | Cooney ................ | H05K 7/1449 174/50 |
| 2003/0002261 A1 | * | 1/2003 | Berry ................... | H05K 7/1489 361/727 |

(Continued)

FOREIGN PATENT DOCUMENTS

EP        2919293 A1    9/2015

*Primary Examiner* — Anatoly Vortman
*Assistant Examiner* — Zhengfu J Feng
(74) *Attorney, Agent, or Firm* — John Alumit

(57) ABSTRACT

The invention relates to a structure (1) for housing electronic apparatuses (10) such as boards (11) and the like, wherein the apparatuses are arranged in a container with a drawer (40) insertable and extractable with respect to a frame (20) of the structure (1). On the back wall of the drawer (40) and on the frame (20) connectors (53, 54) are provided which are coupled directly and automatically when the drawer is inserted.

8 Claims, 10 Drawing Sheets

(56) References Cited

U.S. PATENT DOCUMENTS

| | | | |
|---|---|---|---|
| 2006/0164814 A1* | 7/2006 | Titus | G06F 1/184 |
| | | | 361/724 |
| 2007/0175835 A1* | 8/2007 | Liang | H05K 7/1489 |
| | | | 211/26 |
| 2009/0213544 A1* | 8/2009 | Dittus | H05K 7/20727 |
| | | | 361/695 |
| 2009/0250236 A1* | 10/2009 | Corwin | H01R 31/06 |
| | | | 174/59 |
| 2010/0147554 A1* | 6/2010 | Ong | H05K 7/1492 |
| | | | 174/135 |

* cited by examiner

EXTRACTABLE STRUCTURE FOR HOUSING ELECTRONIC COMPONENTS

In its most general aspect, the present invention relates to a structure for housing and/or supporting components of electronic and/or electric equipment, such as boards, switches, printed circuit boards (PCB type), processors, transistors, diodes, control panels and the like.

Hereinafter, for the sake of brevity, reference will be made to the electronic feature to indicate generically all of these components and the apparatuses in which they are present, although some of them or some parts thereof may not be typically electronic components.

As is known, the subject apparatuses are installed in housing structures configured as cabinets or similar substantially parallelepiped containers, which can have various sizes which range from a few tens of centimeters for the transportable or bench apparatuses, up to a few meters for cabinets of computing or control centers of factories, buildings, manufacturing plants and the like.

Irrespective of the size and the shape, the housing structures of interest herein are those which in addition to protecting the electronic components against possible damage caused by external agents (humidity, dust, fire, vandalism, etc.), also serve for supporting and/or installing the same apparatuses.

These structures that contain the apparatuses or the electronic components are also commonly called "racks", which among the various meanings also means shelf or shelving that recalls the fact that the electronic apparatuses are actually housed in the cabinets like objects on shelves.

As a brief information note, it should be noted that the first rack-type cabinets for electronic or electric apparatuses date back a few decades; obviously, they have evolved over time also depending on the different characteristics of the apparatuses they are intended to contain and on the technical and design standards that have gradually been introduced over time.

In fact, there are many technical, electrical safety, accident, fire protection standards or of a different nature which regulate the constructional characteristics of the cabinets discussed herein.

Thus, for example, they may be provided with forced or natural ventilation systems, anti-intrusion elements, power supply blocking groups, connections for the grounding of the racks and/or their components and of the electronic apparatuses.

Also the dimensions of the structures have adapted to the apparatuses housed therein, as they are preferably made with modular architectures so as to be able to build larger structures assembling smaller modules.

Inside the rack-type structures, the apparatuses are arranged on fixed frames, preferably provided with rails which allow the insertion and the extraction of the apparatuses for installation and maintenance operations.

These frames, also called "sub-racks" in the current technical jargon, have multiple dimensions with respect to the individual units or boards that make up the electronic apparatuses; thus, for example, a rather widespread width of the frames is 19" (19 inches), as it combines with the usual horizontal pitch of the units equal to 0.2" (0.2 inches).

For the height of the housing structures, the same considerations made for the width apply, since also in this case they are proportionate to the units or groups of electronic boards, in fact these are also used as unit of measurement to indicate the height of frames or sub-racks; among the most widespread measures we may mention those indicated as 3 U, 6 U and 9 U, corresponding to heights of 5.25" (133.35 mm), 10.5" (266.7 mm) and 15.75" (400.05 mm), respectively.

Connectors are also arranged on the bottom of the structures and/or of the frames for connecting the electronic apparatuses with the external supply wirings of electricity and/or communication data or signals in general: in practice, the various boards or units are inserted one at a time in the housing structure, sliding them into the rails of the frames up to couple the connectors of the boards with those of the structure.

One aspect that relates to this prior art is that of the installation and/or maintenance of the electronic apparatuses; in fact, since the connections are arranged at the back of the structures, they are difficult to reach and this makes it difficult to intervene when a fault occurs.

In practice, all the boards or at least a good part thereof must be removed to allow the manual access of an operator for repairs or to replace components and restore connections or for other reasons.

This can be time consuming and the subsequent restoration of connections and the insertion of the boards can be difficult for the same reasons related to the narrowness of the spaces and to the little accessible placement of the connectors.

For this reason, it is known to set up alternative solutions in which the connectors are more easily accessible.

One of them is to place them in a position above the electronic apparatuses, using the remaining space between them and the upper wall of the compartment of the structure in which they are housed; this solution is effective but is not always feasible since there is not always enough space into the structure to implement it, as it actually causes an increase in the overall dimensions in height which may also be of the order of 45% with respect to traditional structures.

This situation is not acceptable in the case of apparatuses installed on board of means of transport such as trains, subways and the like, where the spaces for the cabinets of electronic apparatuses are limited and so one needs to make the most of them.

Similar considerations also apply in the case of known solutions in which part of the wirings is brought inside the frame or sub-rack, connecting them outside with the usual connectors.

In these solutions, in fact, the back wall of the frame is set back so as to create a back space with respect to the boards, so as to obtain an accessible space therefrom for an operator; it should be noted, however, that also in this case one needs to access to such a space from the top, passing in the free area above the boards and underneath the upper wall of the compartment of the structure in which they are housed.

In other words, it can be said that if one needs to access the back side, it may be impossible to place the cabinet against a wall/back wall or alternatively it would be necessary to leave space between the racks in order to work therein.

In the light of this discussion, it can be said that a technical problem underlying the present invention is to provide a structure and/or system for housing electronic apparatuses which is able to overcome the drawbacks outlined above with reference to the prior art.

In other words, an object of the invention is to provide a structure and/or a system that simplifies the installation and maintenance of electronic apparatuses without increasing bulk or requiring excessive spaces, so as to be advantageously used for special applications such as trains, subways and transportation in general.

The solution idea of this problem is to set up a structure in which the apparatuses can be introduced or removed without disconnecting the external wiring connections: this makes it possible to perform maintenance operations outside and insert the apparatuses easily and quickly.

The features of the invention are set out more specifically in the claims appended to this description; such features will become apparent in the light of an exemplary embodiment of the invention, provided hereinafter by way of non-limiting example with reference to the accompanying drawings, in which:

Figure 1:
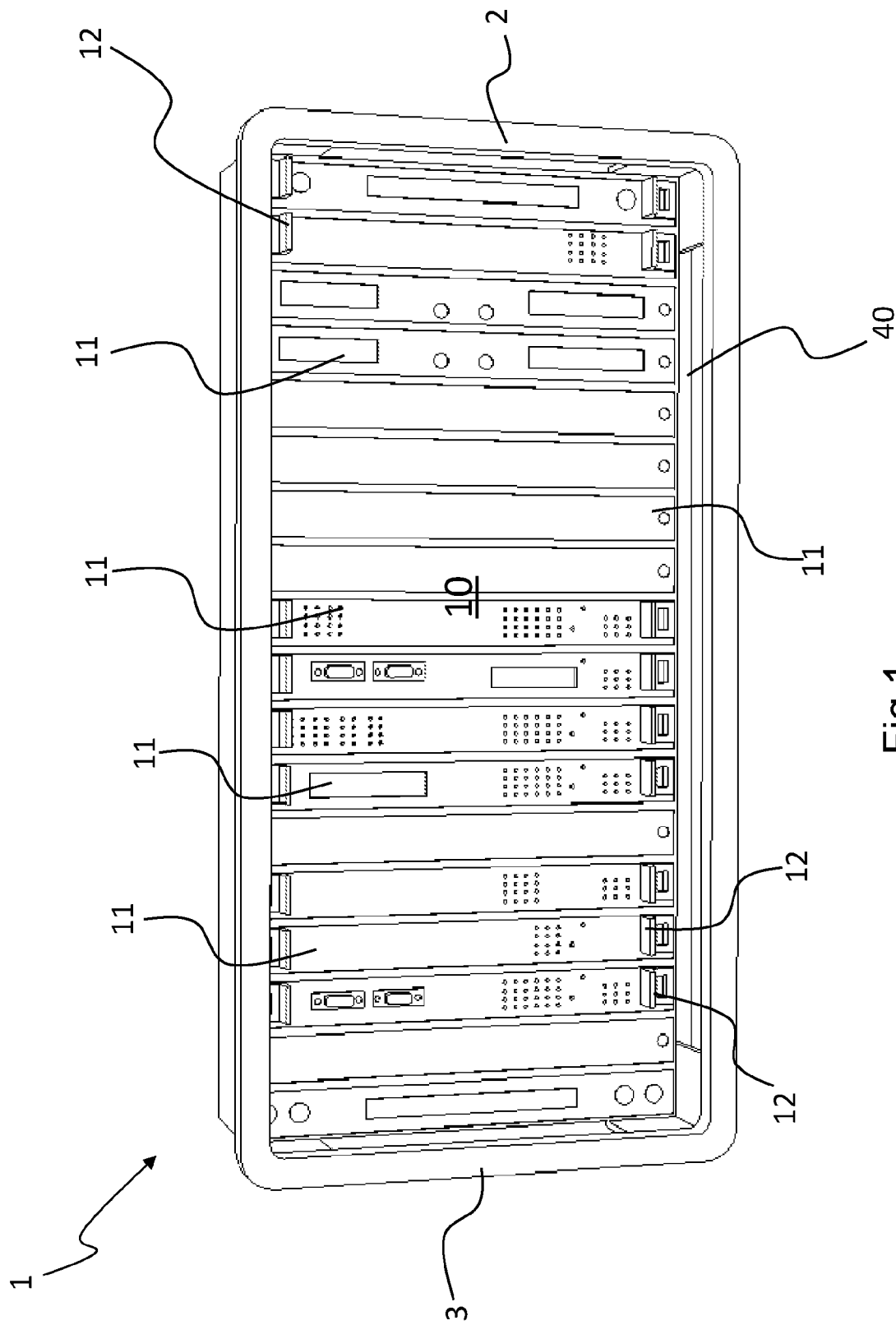
FIG. 1 shows a front view of a structure according to the present invention and of the electronic apparatuses therein.

With reference to the drawings listed above, reference numeral 1 therein indicates as a whole a structure for housing electronic apparatuses according to the invention. Structure 1 is of the rack type, with the meaning of the term already explained above, and in this case it is substantially configured as a cabinet or the like, accessible from the front and preferably closed by doors not shown in the drawings for simplicity and clarity.

Structure 1 thus comprises side 2, 3 and base 4 walls which delimit an inner compartment 5 intended to house the assembly or pack 10 of the electronic apparatuses 11; walls 2, 3 and 4 are preferably made of a metal material, typically steel or aluminum sheet, and are applied on a supporting frame essentially consisting of a series of posts 6 and crosspieces 7, joined together via fixing means such as bolts, clamps, welding or the like.

Posts 6 and crosspieces 7 consist of profiles with L- or C- or H-shaped or similar cross sections, advantageously provided with holes or slots 8 for applying fixing bolts or other fixing means, such as brackets, inserts, joints and the like, preferably in accordance with the technical standards (ISO, EN, DIN, etc.) that exist on the subject.

Before proceeding with the present description of the invention, it should be noted that particular configurations and/or structures and/or features described hereinafter with reference to the non-limiting example can be taken individually or combined in any suitable manner with one another or with other elements, in one or more embodiments of the invention, also different from those exemplified herein; moreover, the reference numerals used hereinafter are for convenience only and do not define or limit the scope of protection or the scope of the various embodiments. Likewise, the numeral and spatial references and/or definitions such as "upper", "lower", "above", "below", "top", "bottom" are meant to refer to the exemplary figures and therefore should not be construed in a limiting sense or such as o exclude different positions of the single elements.

Figure 3:
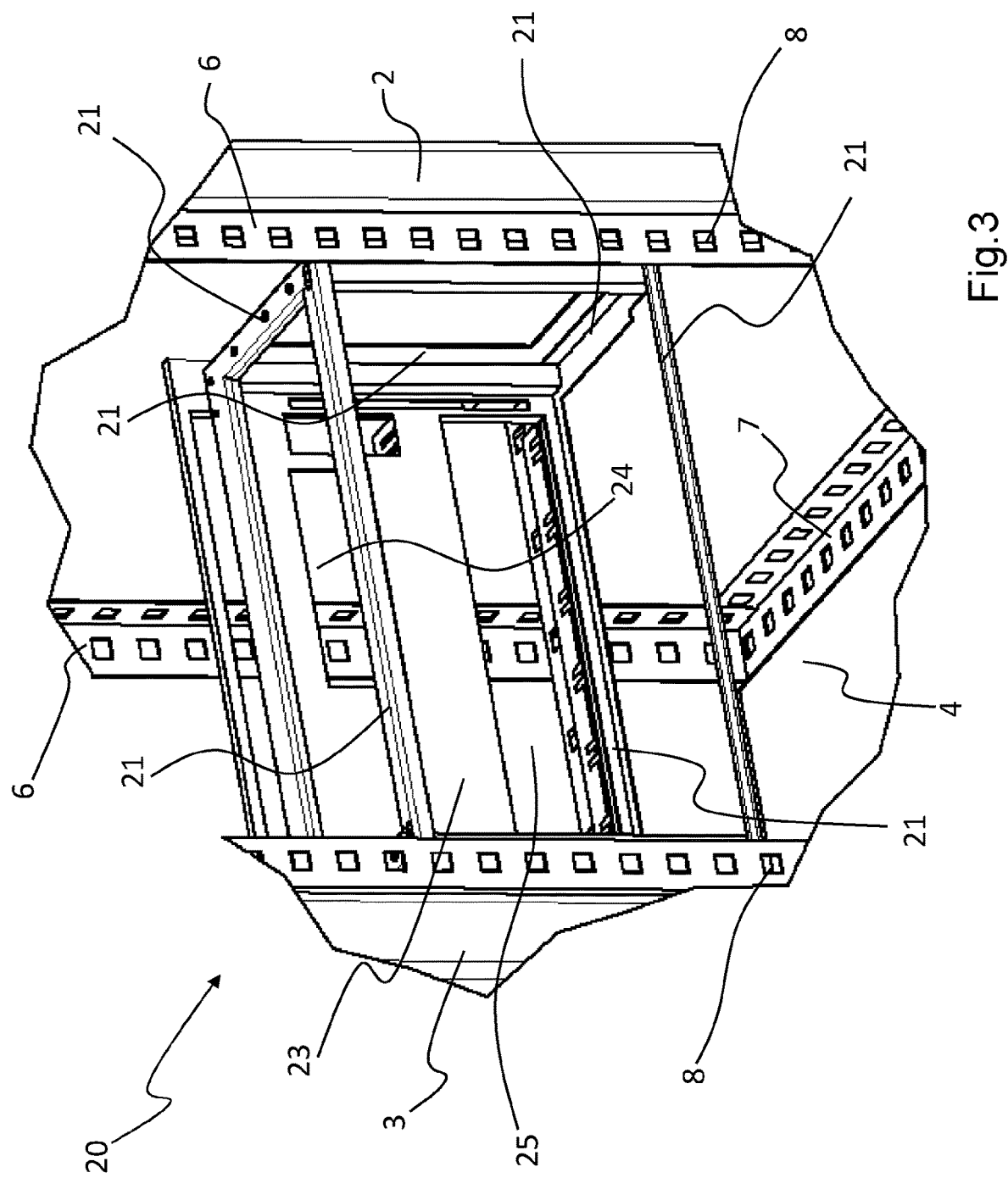
FIG. 3 shows a frame of the structure in the preceding figures.
Figure 5:
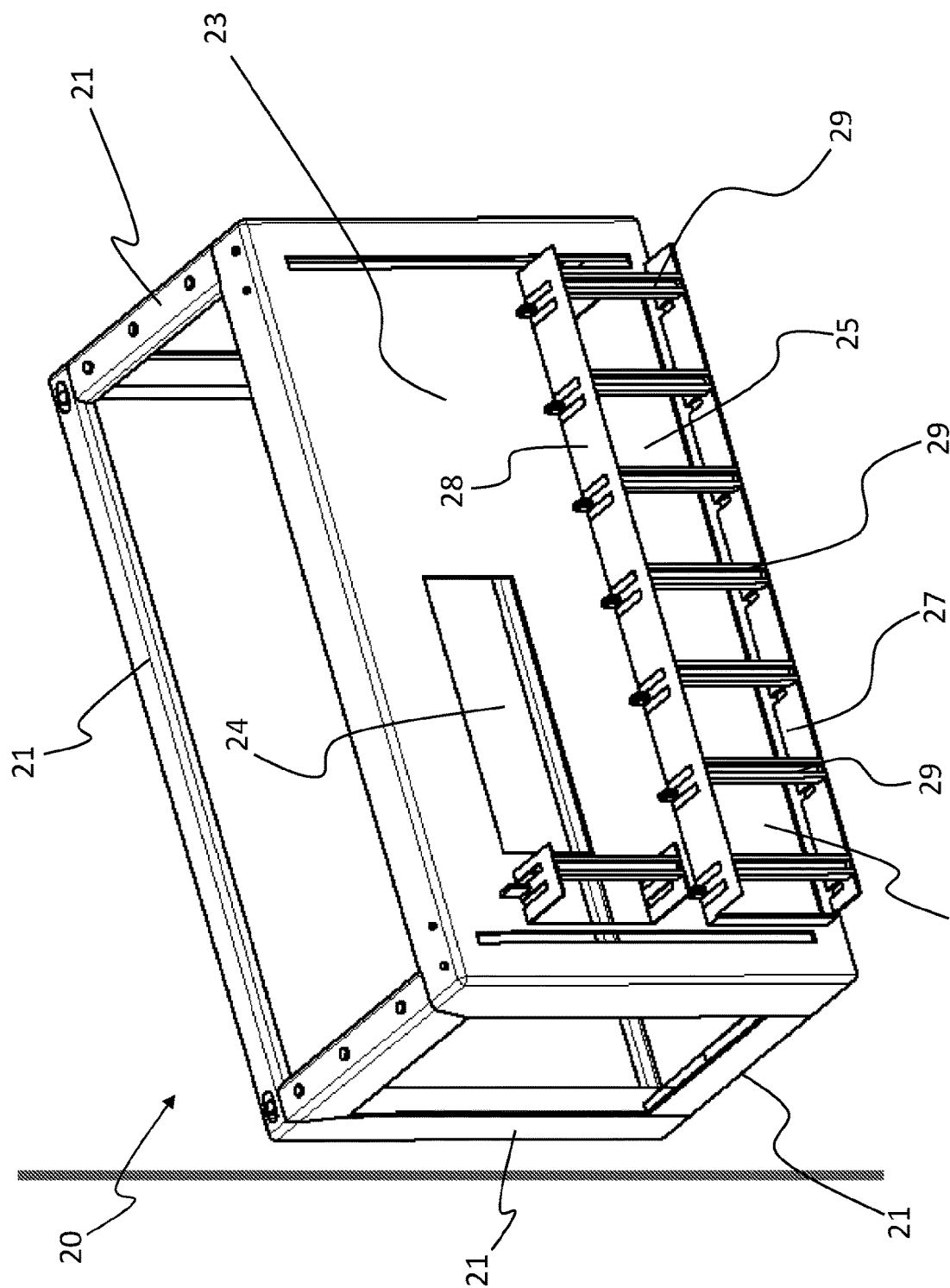
FIG. 5 shows a frame of the structure in the preceding figures from an opposite angle than the one in FIG. 3.
Figure 6:
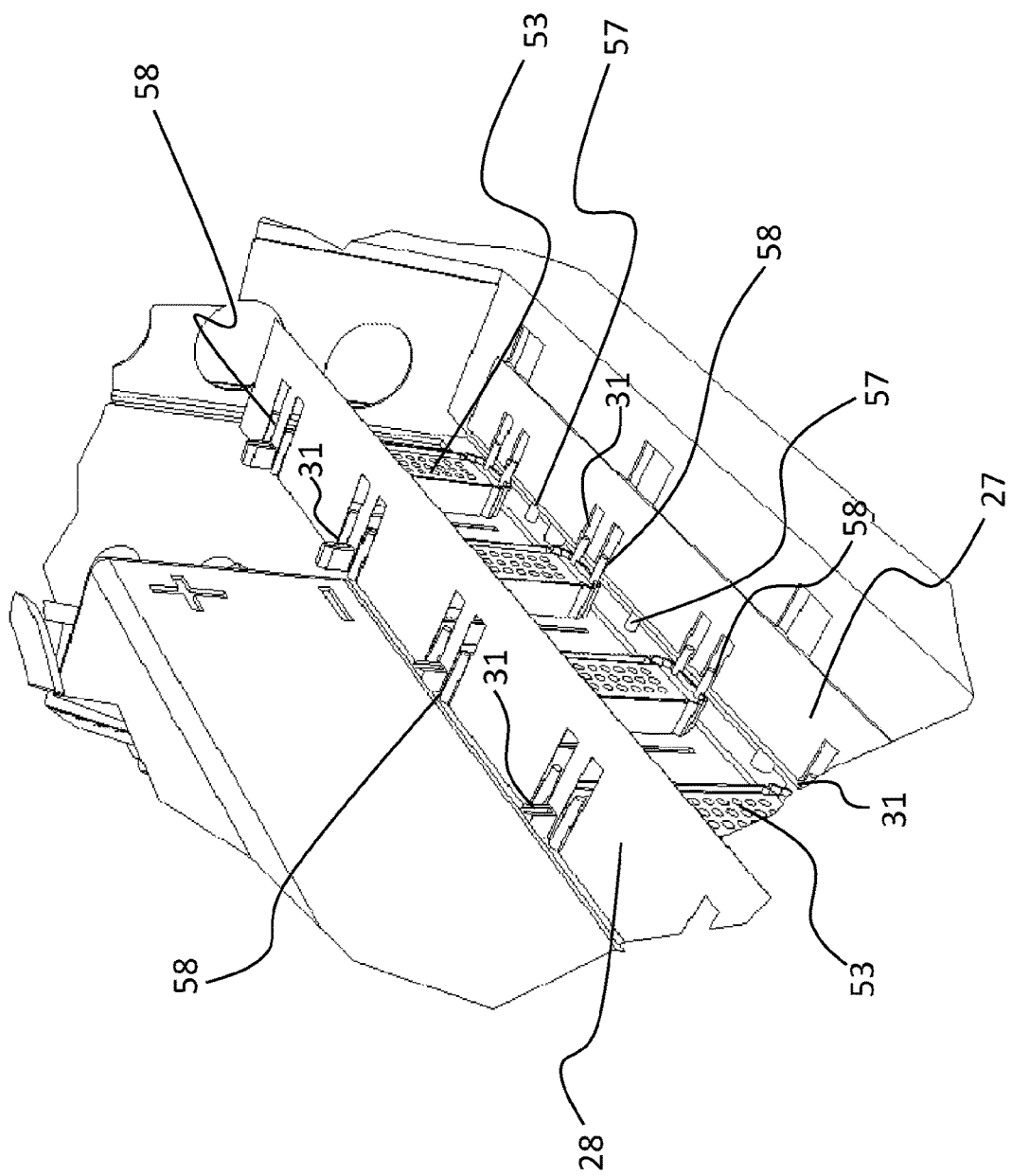
FIG. 6 shows a rear view of the structure in the preceding figures.
Figure 7:
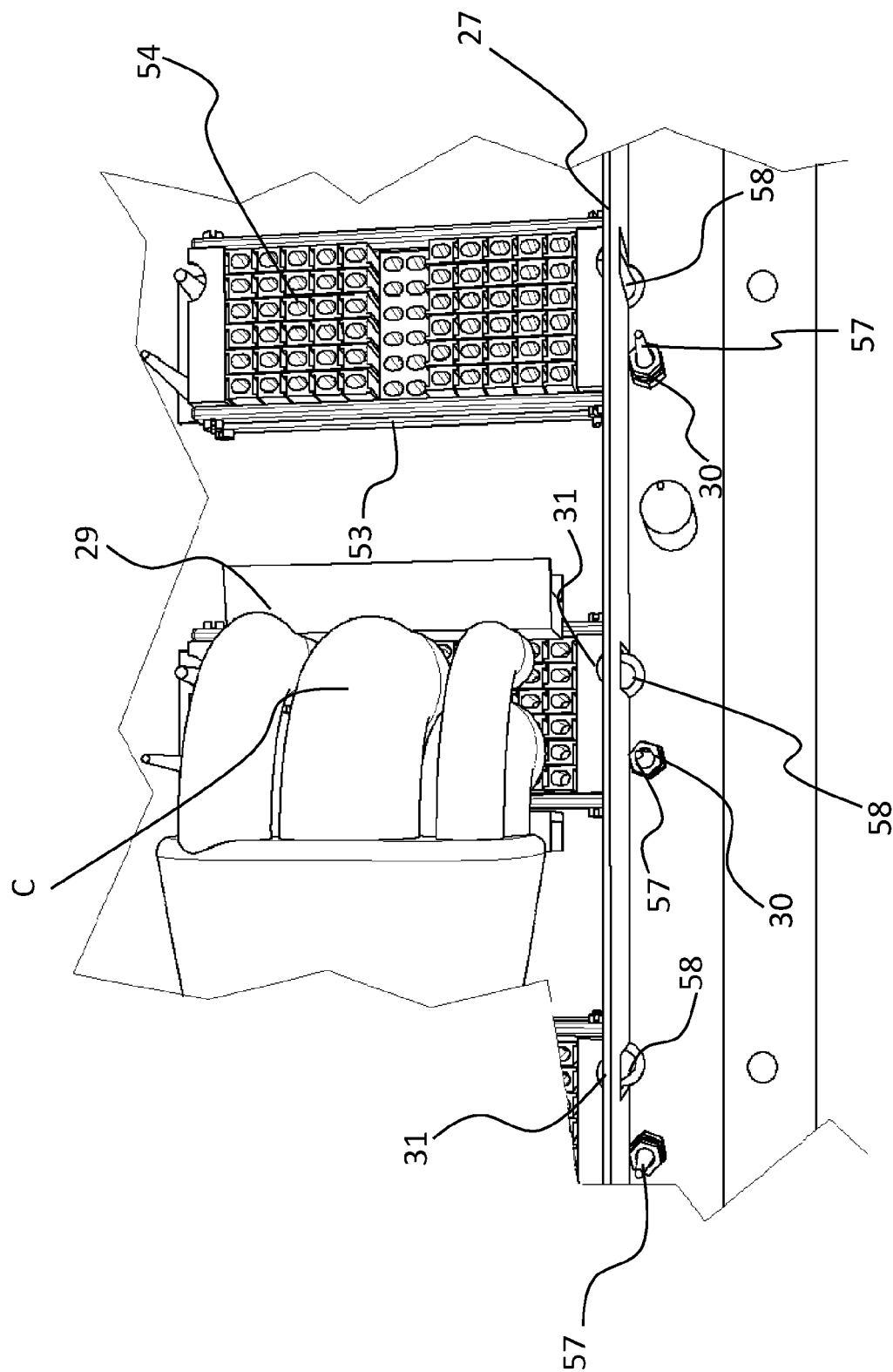
FIG. 7 shows some coupled connectors of the structure in the preceding figures where the wirings are visible.

Bearing this premise in mind, it can be said that posts 6 and crosspieces 7 of structure 1 according to the invention are advantageously used in this case also for fixing one or more frames 20 for supporting the electronic apparatuses 10 (contained within drawers 40), as best seen in FIGS. 3 and 5.

To this end, frame 20 is preferably made according to the geometry of a parallelepiped, with mainly open faces and edges consisting of a series of rod-like elements or profiles 21, in order to lighten the structure thereof and reduce the weight thereof in addition to promoting air circulation for cooling apparatuses 10.

According to the preferred embodiment, some of the sides of frame 20 may consist of rectangular frames, rigidly mutually connected along the respective edges via screws, bolts, welding or other suitable fastening means.

Preferably, the back face of frame 20 has a damping wall 23 where one or more openings 24, 25 are formed which will be better described hereinafter; moreover, at one or more of said openings 24, 25, are arranged shelves 27, 28 which allow placing support elements 29.

According to a preferred embodiment, elements 29 serve for managing the cables leading to the floating connectors 54 (which are secured to frame 20), as it will become apparent hereinafter.

Frame 20 is fixed to posts 6 and/or to crosspieces 7 of the frame of structure 1 and is intended to accommodate the drawer or rack 40, slidable with respect thereto in order to be inserted and extracted, depending on the operating steps of the structure.

Figure 2:
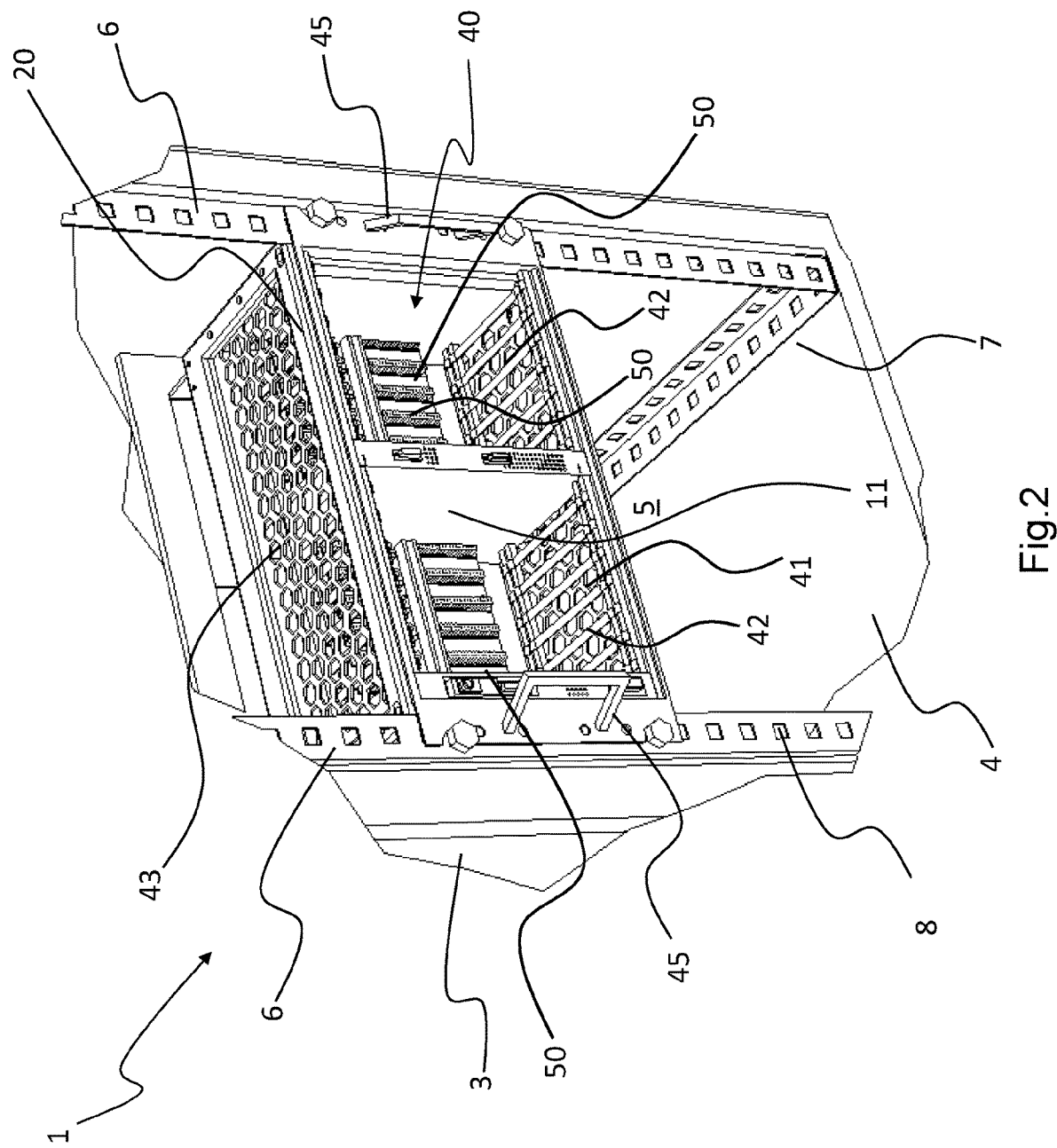
FIG. 2 shows a perspective view of the structure in FIG. 1 without the apparatuses.
Figure 4:
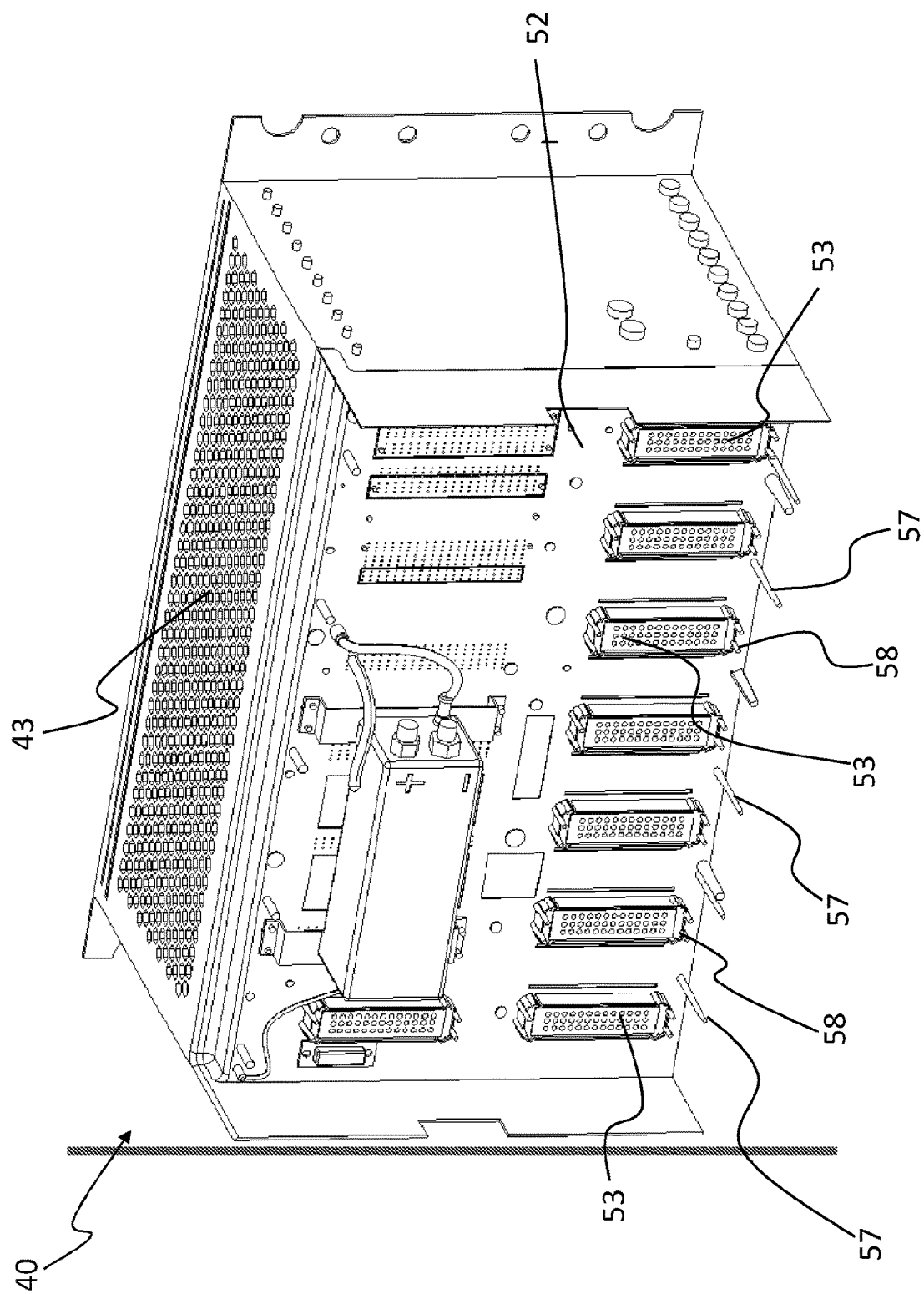
FIG. 4 shows a drawer extracted from the structure in the preceding figures.

The drawer or rack 40, better shown in FIGS. 2 and 4, is essentially configured as a parallelepiped cage, open at the front to allow the introduction and extraction of the single boards 11 that make up assembly 10 of the electronic apparatuses.

Rails 42 are arranged on the lower wall or base 41 and on the upper one 43 of drawer 40, substantially configured as tracks along which the single units or boards 11 that make up the apparatuses intended to be housed in structure 1 can slide.

Preferably, the lower 41 and upper 43 walls of drawer 40 are pierced or otherwise made so as to facilitate the venting of hot air generated by the electronic apparatuses 10 during the operation thereof.

Figure 8:
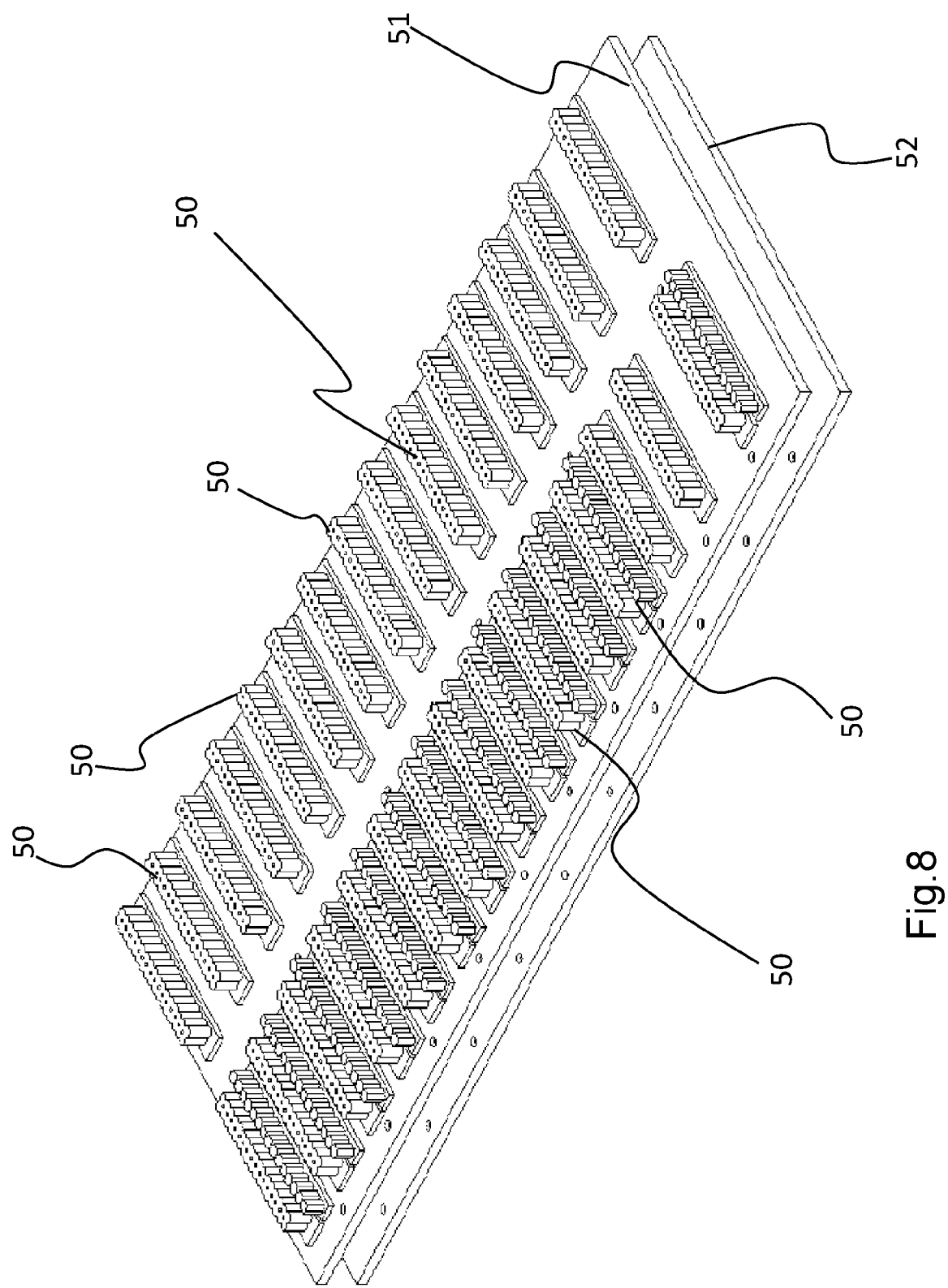
FIG. 8 shows an internal detail of the structure in the preceding figures.

The single units or boards 11 are further preferably provided with hooking or stopping means 12 which allow the retention hereof in the end of stroke position in which the units or boards 11 engage with the respective connectors 50, arranged on the back wall 51 of drawer 40 better shown in FIG. 8.

As can be seen, according to the preferred embodiment of the invention, the back wall of drawer 40 is double and comprises the first wall 51 which is essentially a PCB (Printed Circuit Board) to which the first connectors 50 are applied, juxtaposed to a second wall 52 adjacent to the first one, which supports output connectors or second connectors 53.

The latter are intended to be connected with the external wirings C by respective connectors 54 which are preferably floating; floating connectors suitable for the purpose are commercially available on the market (for example from the Japanese company Iriso Electronics or the American company Mouser Electronics).

Advantageously, the first connectors 50 which are at the front respect to the installed operating conditions of drawer 40, are connected to the second connectors 53, which are rear, via further third connectors 55 which implement the interconnections between walls 51 and 52: in practice, the latter is also a PCB (Printed Circuit Board) in which the tracks of the printed circuit board thereon act as connection conductors between connectors 55 and 53.

This allows having a compact and efficient connection between connectors 50 and 53 so as to allow making complex junctions in a small space.

According to a preferred embodiment, centering and positioning means are provided on the second plate or wall 52 which in the example shown consist of centering pins 57, 58, projecting from the rear side of plate 52, i.e. the one facing the back of drawer 40. More specifically, the first pins 57 are associated with the structure of drawer 40 while the second pins 58 are associated with the rear connectors 53.

The centering pins 57 and 58 are arranged in the most appropriate manner depending on the shape and/or size of the coupling of frame 20 and drawer 40 and connectors 53 and 54, respectively; for example, pins 57, 58 may be placed side by side in pairs as forks, or staggered, so that when drawer 40 is inserted into the respective frame 20, pins 57 engage with abutment holes 30 in wall 23 of the frame near shelves 27 and 28: in this way, when drawer 40 is inserted into frame 20, the centering pins 57 of the first one are inserted into holes 30 of the second one, thereby ensuring the precise and stable positioning of drawer 40 into frame 20, while the other pins 58 engage with corresponding seats or holes 31 provided in the floating connectors 54.

This therefore allows connectors 53 to mate directly with the floating connectors 54 of the external cables C, when drawer 40 is inserted into frame 20: in this context, it should be noted that the use of output connectors 54 of the floating type allows compensating for the unavoidable clearances due to the dimensional tolerances of mechanical coupling of drawer 40 with frame 20, ensuring a reliable and effective electrical connection.

The operation of the housing structure 1 according to the invention is apparent in the light of the above explanation and the accompanying drawings.

In fact, once frame 20 has been fixed to posts 6 and crosspieces 7 of the supporting frame in the selected position (using slots 8 formed on posts 6 and crosspieces 7), it is possible to insert drawer 40 therein by sliding it towards the rear end wall 23 of frame 20.

To this end, drawer 40 may be advantageously provided with front handles or grips 45, easily graspable by a user to handle drawer 40 and introduce it into or remove it from, frame 20.

At the end of this operation, drawer 40 is in the operating condition of insertion into frame 20, the output connectors 53 that are located posteriorly thereto engage with the external ones 54 associated with the network cables; as explained above, at this stage, the centering pins 57, 58 and the respective abutment holes 30, 31 make the positioning of drawer 40 into frame 20 precise so that, accordingly, and in particular due to pins 58, the output connectors 53 can be coupled directly with those 54 of the network cables at the end of the drawer stroke.

Once this operating condition of drawer 40 has been reached, it is possible to install the electronic apparatuses 10, inserting the single boards or units 11 along rails 42 inside the drawer; the first connectors 50 on the bottom of drawer 40 engage with the contacts of boards 11 when these are inserted and locked in the operating position.

At the end of this step, apparatuses 10 are connected to the external network through the connection established between the first connectors 50 and the output 53 ones, applied on the respective plates 51 and 52.

When maintenance or a replacement of the electronic apparatuses 10 is required, drawer 40 is extracted from the housing structure 1 in the reverse manner to its introduction.

This makes it possible to perform all the necessary operations on a workbench or otherwise outside of the housing structure 1, thus facilitating the task of an operator as there are no problems of accessibility or lack of space.

In other words, the invention allows obtaining some considerable advantages.

A first advantage is to allow the drawer or rack 40 to be removed from structure 1, so as to be able to work thereon separately with greater comfort, while in another aspect the second advantage is to be able to remove in a single action and quickly the whole rack or drawer 40 to replace it without acting on the wirings which at the same time occupy a very limited space.

Once the maintenance or replacement operations of faulty components have been completed, drawer 40 with assembly 10 of apparatuses 11 in its interior is again inserted into frame 20 as explained above, so that apparatuses 10 are connected directly to the network when the drawer is repositioned in the operating condition; alternatively, if necessary, it is also possible to insert a new drawer 40 in place of that removed that will be repaired on site, in order to limit the intervention times to the minimum.

It should be noted that this procedure can also be followed for the first installation of apparatuses 10, as an alternative to inserting them into drawer 40 when this is already in position within frame 20.

As can be understood, this solution provided by structure 1, in which assembly 10 of the various apparatuses 11 is housed in a drawer 40 extractable from a fixed frame 20 allows solving the technical problem underlying the present invention and initially outlined.

In fact, while the housing structure 1 is of the rack type with the advantages derived therefrom, it allows installing and maintaining the electronic apparatuses 10 in a simple and effective manner without the difficulties found in the prior art related to poor accessibility into structure 1.

The housing structure 1 according to the invention is therefore particularly suitable for use on public transport such as trains, subways, tramways and the like, where the space available is usually fairly tight.

This result is achieved, among others, also by virtue of the particular drawer 40 where the electronic apparatuses 10 are arranged, which can be easily inserted and extracted with respect to the housing structure 1 and, at the same time, ensures the connection of assembly 10 of apparatuses 11 to the external network in a reliable and accurate manner.

In this context, it should be noted that such a result is achieved without any significant increase of the overall dimensions of the housing structure 1, due to its components such as frame 20 and drawer 40.

Frame 20 is in fact predominantly open and essentially has the function of guide and/or support of drawer 40; it is therefore lightweight and not bulky.

Likewise, drawer 40 is provided with the wall or plate 51 where there are connectors 50 which mate with boards 11 of the apparatuses, which wall or plate 51 preferably has a dual function that in the known structures is not taken by the frame or sub-rack.

A first function is that of a supporting element for the first electrical connectors 50 which mate with those of apparatuses 11, while the second is that of connection between the first and second connectors 50 and 53. To this end, plate 51 is preferably made as a printed circuit of the PCB type; in other words, plate 51 is not only a structural wall element which supports connectors 50, but also a circuit component which cooperates to the operation of the apparatuses.

Figure 9:
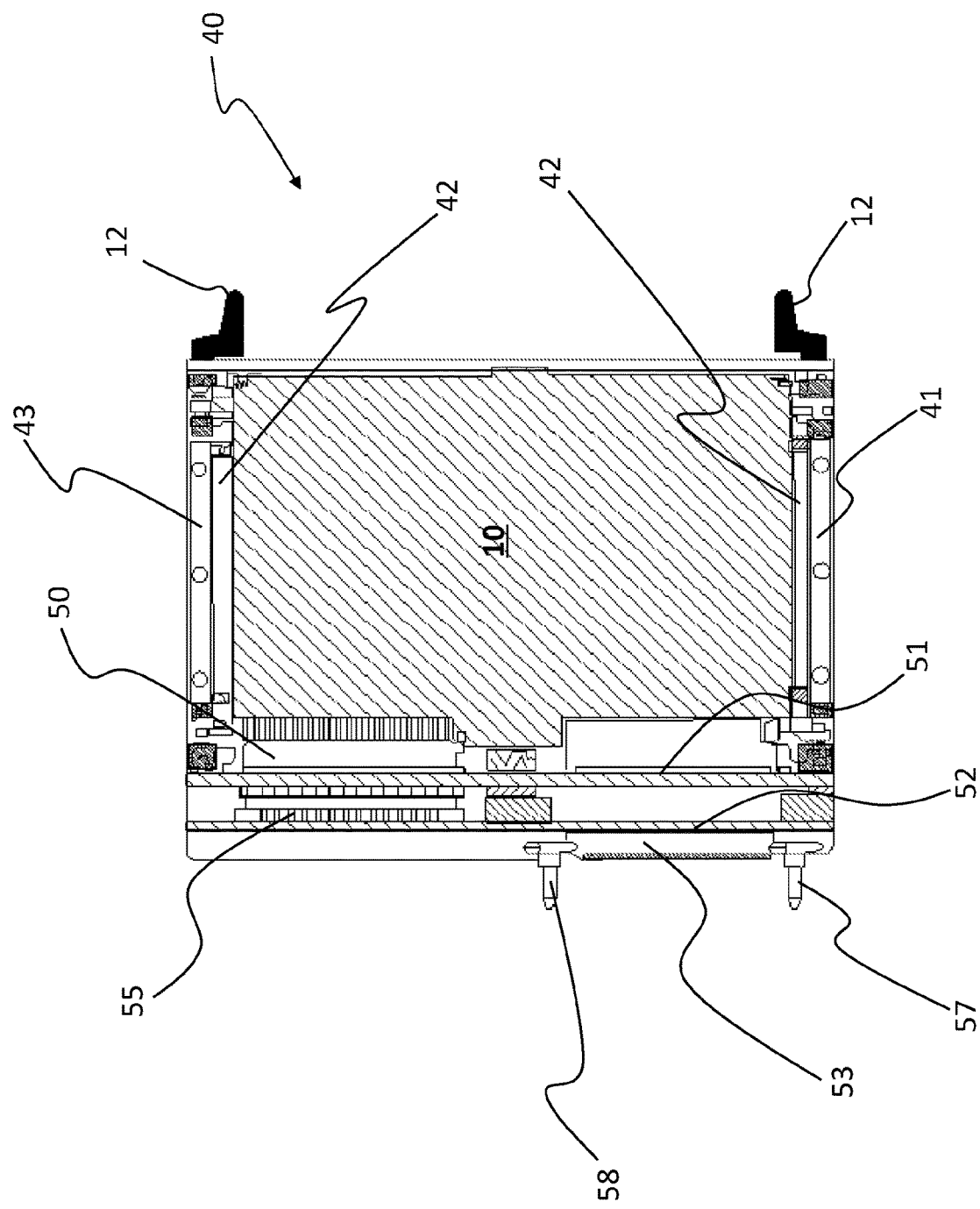
FIG. 9 shows a cross section of the detail in FIG. 4 of the structure in the preceding figures.
Figure 10:
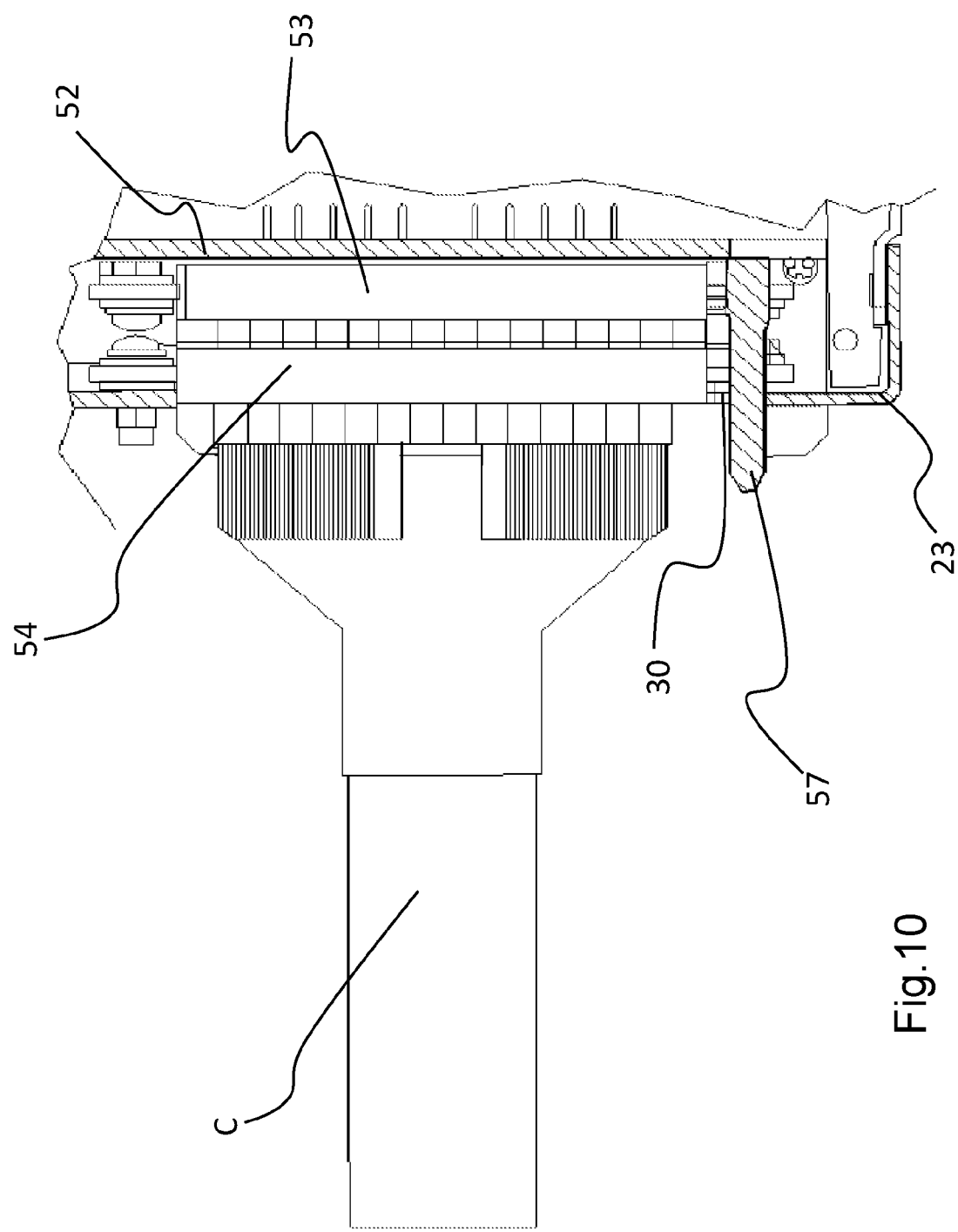
FIG. 10 shows an enlargement of a detail of the apparatus in the preceding figures.

The second wall or backplate 52 is juxtaposed to the first 51 and consequently does not involve any significant increase in the overall dimensions, as can also be seen in the section in FIG. 9.

However, it achieves important advantages in addition to serving as an interface with the external network, such as aiding an effective coupling of the output connectors 53 by virtue of the centering pins 58 with which they are provided.

However, it should not be excluded that in certain applications, the two plates or walls 51, 52 are incorporated in a single one, for example a PCB board on which the various components are applied, including connectors 50, 53 and/or the centering pins 57, 58.

Of course, variants of the invention with respect to the example described above are possible.

Firstly, it is clear that the housing structure 1 may comprise a number of frames 20 and/or drawers 40 higher than the single one shown in the drawings; in other words, it will be possible to have housing structures 20 with two, three or more extractable drawers such as 40 of the example shown.

It should also be noted that there may also be multiple drawers supported by a same frame 20: in other words, a larger frame 20 or otherwise suitably configured so as to contain two or more superposed drawers, similarly to what happens in common drawer cabinets.

Preferably, both frame(s) 20 and drawer(s) 40 will have dimensions compatible with those of the modules and of the electronic apparatuses known in the art (e.g. 5.25", i.e., 133.35 mm; 10.5", i.e. 266.7 mm; 15.75", i.e., 400.05 mm; 19" and so forth); however, these criteria may be disregarded, possibly in the case of special applications.

It is also apparent that the housing structure 1 may be self-supporting like a cabinet, or be part of a larger cabinet which comprises other structures also configured differently. In the first case, the frame formed by posts 6 and crosspieces 7 will be self-supporting, while in the second case it may be fixed to a wall or associated with beams, pillars or other structural elements.

All these variants still fall within the scope of the following claims.

The invention claimed is:

1. A structure for housing electronic apparatuses (10, 11) comprising a frame (20) for supporting the electronic apparatuses (10, 11), connection means in the form of first connectors (50), second connectors (53), floating-type connectors (54), and third connectors (55), for connecting the electronic apparatuses (10, 11) to external wirings (C), wherein said structure comprises a drawer (40) with at least two backwalls, an inner backwall (51) and an outer backwall (52), said drawer can be extracted from the frame (20) and which receives the electronic apparatuses (10, 11), wherein the first connectors (50) are disposed at a front side of the inner backwall facing within the drawer, the second connectors (53) are disposed at a rear side of the outer backwall facing away from the drawer, and the third connectors are disposed between the at least two backwalls and serve to connect the first connectors and the second connectors between the at least two backwalls; wherein said floating-type connectors (54) connect to the second connectors (53) and to the external wirings (C); and wherein said frame is a parallelpiped with open faces and edges consisting of a series of rods to lighten the structure and promote air circulation.

2. The structure according to claim 1, wherein the floating-type connectors (54) are associated with the frame (20).

3. The structure according to claim 1, wherein when the drawer (40) is in an operating condition, inserted in the frame (20), at least a part of the first connectors (50), the second connectors (53), the floating-type connectors (54), and the third connectors (55) are engaged with the external wirings (C) to establish a connection to the electronic apparatuses (10, 11).

4. The structure according to claim 1, wherein the first connectors (50) engage with the electronic apparatuses (10, 11) when said electronic apparatuses are in an operating condition.

5. The structure according to claim 1, wherein the drawer (40) comprises centering means (57, 58) adapted to cooperate with the frame (20) or at least abutment holes (30, 31) thereof, so as to ensure a predefined mutual positioning resulting in the coupling of the second connectors (53) and the floating-type connectors (54).

6. The structure according to claim 1, wherein the frame (20) comprises a damping wall (23) extending from one end of the frame to another end of the frame, which, when the drawer (40) is in an operating condition, the drawer cooperates with the outer backwall (52) of the drawer that carries at least the second connectors (53) for connecting to the external wirings (C).

7. The structure according to claim 6, wherein the floating-type connectors (54) are associated with said damping wall (23) of the frame (20).

8. The structure according to claim 1, which consists of a cabinet wherein the frame (20) is secured to crosspieces and/or posts (6, 7) with L-, C-, or H-shaped profiles of the cabinet.

* * * * *